(12) United States Patent
Hsien et al.

(10) Patent No.: US 7,646,583 B2
(45) Date of Patent: Jan. 12, 2010

(54) COMMON CENTROID SYMMETRIC STRUCTURE CAPACITOR

(75) Inventors: Szu-Kang Hsien, Hsinchu (TW); I-Hsun Chen, Hsinchu (TW); Chien-Hua Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 228 days.

(21) Appl. No.: 11/806,756

(22) Filed: Jun. 4, 2007

(65) Prior Publication Data

US 2008/0158772 A1 Jul. 3, 2008

(30) Foreign Application Priority Data

Dec. 29, 2006 (TW) .............................. 95150060 A (51) Int. Cl.
*H01G 4/005* (2006.01)
*H01G 4/38* (2006.01)
*H01L 27/108* (2006.01)
*H01L 29/94* (2006.01)

(52) U.S. Cl. ................ 361/303; 361/328; 257/303

(58) Field of Classification Search ............ 361/303, 361/311, 304, 306.3, 603.1, 305, 328, 329, 361/330, 312, 313, 307; 257/306, 303, 352, 257/308, 307
See application file for complete search history.

(56) References Cited

U.S. PATENT DOCUMENTS

| | | | |
|---|---|---|---|
| 3,675,095 A * | 7/1972 | Lehmann ................. 361/303 |
| 5,208,725 A | 5/1993 | Akcasu | |
| 6,016,019 A * | 1/2000 | Wojewoda .............. 307/109 |
| 6,037,621 A | 3/2000 | Wilson | |
| 6,297,524 B1 | 10/2001 | Vathulya et al. | |
| 6,410,954 B1 | 6/2002 | Sowlati et al. | |
| 6,737,698 B1 | 5/2004 | Paul et al. | |
| 6,765,778 B1 | 7/2004 | Du et al. | |
| 7,057,873 B2 * | 6/2006 | Mou et al. .............. 361/301.5 |
| 2004/0036143 A1 | 2/2004 | Hu et al. | |
| 2004/0174655 A1 | 9/2004 | Tsai et al. | |
| 2005/0280060 A1 | 12/2005 | Juengling | |
| 2006/0124972 A1 * | 6/2006 | Booth et al. ............ 257/222 |
| 2007/0126078 A1 * | 6/2007 | Huang et al. ........... 257/532 |
| 2007/0296013 A1 * | 12/2007 | Chang et al. ........... 257/306 |
| 2008/0002332 A1 * | 1/2008 | Chen ........................ 361/328 |

FOREIGN PATENT DOCUMENTS

JP 11219842 A * 8/1999

* cited by examiner

*Primary Examiner*—Eric Thomas
*Assistant Examiner*—David M Sinclair
(74) *Attorney, Agent, or Firm*—Rabin & Berdo, P.C.

(57) ABSTRACT

A common centroid symmetric structure capacitor is provided, which includes a first metal layer, a second metal layer, a third metal layer, and a fourth metal layer. The first metal layer is adjacent to the second metal layer, the third metal layer is adjacent to the first metal layer, the fourth metal layer is adjacent to the second metal layer, and the first metal layer is symmetric to the fourth metal layer, the second metal layer is symmetric to the third metal layer. Each of the metal layers has two sets of metal wires, each set has a plurality of metal wires, and each of the metal wires in each set is arranged in an interlaced manner.

2 Claims, 14 Drawing Sheets

COMMON CENTROID SYMMETRIC STRUCTURE CAPACITOR

CROSS-REFERENCE TO RELATED APPLICATIONS

This non-provisional application claims priority under 35 U.S.C. § 119(a) on Patent Application No(s). 095150060 filed in Taiwan, R.O.C. on Dec. 29, 2006, the entire contents of which are hereby incorporated by reference.

BACKGROUND OF THE INVENTION

1. Field of Invention

The present invention relates to a capacitor, and more particularly, to a common centroid symmetric structure capacitor.

2. Related Art

Currently, the development of the SOC technology becomes increasingly matured and the integration of IC circuits is complicated, such that the quantity of the components accommodated in a unit area must be increased correspondingly. Therefore, many passive components that must be externally connected due to a large area thereof, such as capacitors and inductors, must be integrated into one chip.

In an IC layout, a plate capacitor is formed by different metal layers. By using a vertical electric field, with the reduction of effective line width, the occupied chip area is increased correspondingly. Furthermore, under the circumstance that the line width is reduced, with a limited area or volume, how to achieve the same capacitance is also a major technical problem of the IC layout. Thus, prior arts have provided many solutions.

For example, U.S. Pat. No. 5,208,725 discloses a capacitor structure having a first conductive layer and a second conductive layer. Each of the conductive layers comprises a plurality of stripe structures which are parallel to each other. The main technical features are that a finger structure is adopted and a lateral electric field and a vertical electric field are utilized to enhance the capacitance density.

U.S. Pat. No. 6,037,621 discloses a capacitor structure having a lower metal layer and an upper metal layer. An array of metal islands disposed between the lower and the upper metal layers, and each island of the array of islands is connected to either the upper layer or the lower layer. The main technical features are that the array of metal islands is realized through vias formed between the metals and a lateral electric field and a vertical electric field are utilized to enhance the capacitance density.

U.S. Pat. No. 6,297,524 discloses a capacitor structure having a first conductive layer and at least one second conductive layer. The conductive layers are formed of electrically conductive concentric ring-shaped lines which are arranged in concentric ring-shaped stacks. Each of the conductive layers is connected by a conductive via. The main technical features of the patent are that a concentric ring-shaped structure is utilized, a lateral electric field is utilized, and the upper and lower metals are penetrated by a via, so as to enhance the capacitance density.

U.S. Pat. No. 6,410,954 discloses a capacitor structure consisting of a first conductive layer and at least one second conductive layer. The conductive layers are formed of open-loop concentric ring-shaped lines and the second conductive layer covers the first conductive layer. The main technical features of the patent are that a ring-shaped structure is also utilized, and a lateral electric field and a vertical electric field are utilized by interlacing an upper metal and a lower metal, so as to enhance the capacitance density.

U.S. Early Publication No. 2004/0036143 discloses a capacitor structure, in which an inner vertical plate and an outer vertical plate are disposed on a substrate, a grid structure is defined by the outer vertical plate, and meanwhile a horizontal plate is disposed, so as to prevent parasitic capacitance from being generated between the substrate and the inner and outer vertical plates. The main technical features are that a grid structure is employed and a lateral electric field is utilized to enhance the capacitance density.

U.S. Pat. No. 6,737,698 discloses a capacitor structure, and the main technical features are that a mask structure is utilized to limit an electric field between two masks.

U.S. Pat. No. 6,765,778 discloses a capacitor structure consisting of a plurality of stacks. A second stack is a first nearest neighbor to a first stack, a third stack is a second nearest neighbor to the first stack, and each of the three stacks defines vertices of an isosceles triangle formed in a plane substantially perpendicular to the three stacks. The main technical features are that a hexagonal perpendicular stacking structure and a lateral electric field are utilized to enhance the capacitance density.

U.S. Early Publication No. 2004/0174655 discloses a capacitor structure mainly consisting of two layers of finger structures interlaced with each other. The main technical features are that the finger structures are utilized, and the finger structures on the upper and lower layers are perpendicularly interlaced, so as to reduce the unmatched conditions of the interlayer metals and enhance the capacitance density.

U.S. Early Publication No. 2005/0280060 discloses a capacitor structure, in which an inner box-shaped capacitor and an outer box-shaped capacitor are arranged in a concentric nested shape. The main technical features are that a concentric ring-shaped structure is utilized and a lateral electric field is utilized to enhance the capacitance density.

SUMMARY OF THE INVENTION

The present invention is directed to provide a common centroid symmetric structure capacitor. The capacitance is achieved by using a lateral electric field of metal wires on the same layer. Thus, with the reduction of effective line width, the capacitance in a unit volume is increased, so as to enhance the capacitance density.

One example of the common centroid symmetric structure capacitor provided by the present invention comprises a first metal layer, a second metal layer, a third metal layer, and a fourth metal layer. The first metal layer is adjacent to the second metal layer, the third metal layer is adjacent to the first metal layer, the fourth metal layer is adjacent to the second metal layer, and the first metal layer is symmetric to the fourth metal layer, the second metal layer is symmetric to the third metal layer. Each of the metal layers has two sets of metal wires, each set has a plurality of metal wires, and the metal wires in each set are arranged in an interlaced manner.

One example of the common centroid symmetric structure capacitor provided by the present invention comprises a first metal layer and a second metal layer, and the second metal layer is arranged symmetric to the first metal layer. Each of the metal layers has two sets of metal wires, each set has a plurality of metal wires, and the metal wires in each set are arranged in an interlaced manner. The interlaced manner of the second metal layer is different from that of the first metal layer.

The capacitor structure provided by the present invention can be fully utilized under a limited volume, thereby solving a general problem that a plate capacitor occupies too much volume or area of a chip.

Furthermore, the symmetric capacitor structure provided by the present invention not only facilitates the matching in the layout, but also may generate a counter magnetic field with symmetric currents in reverse directions, so as to reduce the inductance, raise the self-vibration frequency, and improve the performance of the capacitor.

The above description of the content of the present invention and the following illustration of the embodiments are intended to demonstrate and explain the principle of the present invention and to provide further explanations of the claims of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The detailed features and advantages of the present invention will be described in detail in the following embodiments. Those skilled in the arts can easily understand and implement the content of the present invention. Furthermore, the relative objectives and advantages of the present invention are apparent to those skilled in the arts with reference to the content disclosed in the specification, claims, and drawings.

Figure 1:
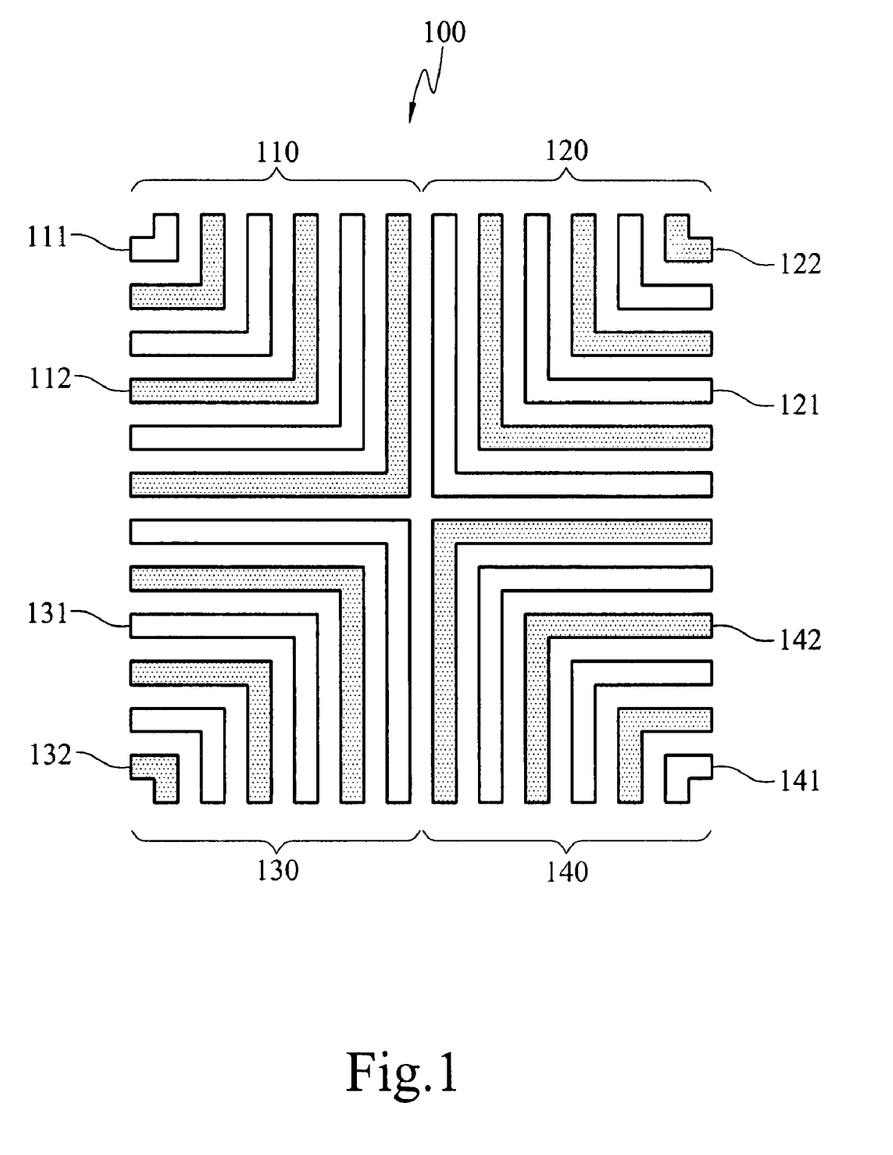
FIG. 1 is a schematic structural diagram of an embodiment of the common centroid symmetric structure capacitor provided by the present invention.

Referring to FIG. 1, a schematic structural diagram of a common centroid symmetric structure capacitor provided by the present invention is shown.

As shown in the figure, the common centroid symmetric structure capacitor 100 provided by the present invention comprises a first metal layer 110, a second metal layer 120, a third metal layer 130, and a fourth metal layer 140. The first metal layer 110 is adjacent to the second metal layer 120, the third metal layer 130 is adjacent to the first metal layer 110, the fourth metal layer 140 is adjacent to the second metal layer 120, and the first metal layer 110 is symmetric to the fourth metal layer 140, the second metal layer 120 is symmetric to the third metal layer 130.

The first metal layer 110 has a first set 111 of metal wires and a second set 112 of metal wires, with each set having a plurality of metal wires. Each of the metal wires in the first set 111 and each of the metal wires in the second set 112 are arranged in an interlaced manner.

The second metal layer 120 is adjacent to the first metal layer 110 and has a third set 121 of metal wires and a fourth set 122 of metal wires, with each set having a plurality of metal wires. Each of the metal wires in the third set 121 and each of the metal wires in the fourth set 122 are arranged in an interlaced manner.

The third metal layer 130 is adjacent to the first metal layer 110 and has a fifth set 131 of metal wires and a sixth set 132 of metal wires, with each set having a plurality of metal wires. Each of the metal wires in the fifth set 131 and each of the metal wires in the sixth set 132 are arranged in an interlaced manner.

The fourth metal layer 140 is adjacent to the second metal layer 120 and has a seventh set 141 of metal wires and an eighth set 142 of metal wires, with each set having a plurality of metal wires. Each of the metal wires in the seventh set 141 and each of the metal wires in the eighth set 142 are arranged in an interlaced manner.

The capacitor structure provided by the present invention is in the same metal layer and formed by configuring electrodes in the manner of common centroid symmetry. For example, as shown in FIG. 1, the first metal layer 110 and the fourth metal layer 140 are arranged symmetrically about a diagonal line, i.e., the first metal layer 110 and the fourth metal layer 140 are symmetric about the centroid of a rectangle. The second metal layer 120 and the third metal layer 130 are disposed symmetrically about a diagonal line, i.e., the second metal layer 120 and the third metal layer 130 are symmetric about the centroid of a rectangle. Each of the metal wires on the first metal layer 110 and each of the metal wires on the fourth metal layer 140 are opposite to each other by a right angle portion, and each of the metal layers on the second metal layer 120 and each of the metal layers on the third metal layer 130 are opposite to each other by a right angle portion.

In the embodiment shown in FIG. 1, the metal wires on each of the metal layers are substantially in an L-shape. In addition, other shapes, for example, arc-shape, can also be applied to the structure of the present invention.

Figure 2:
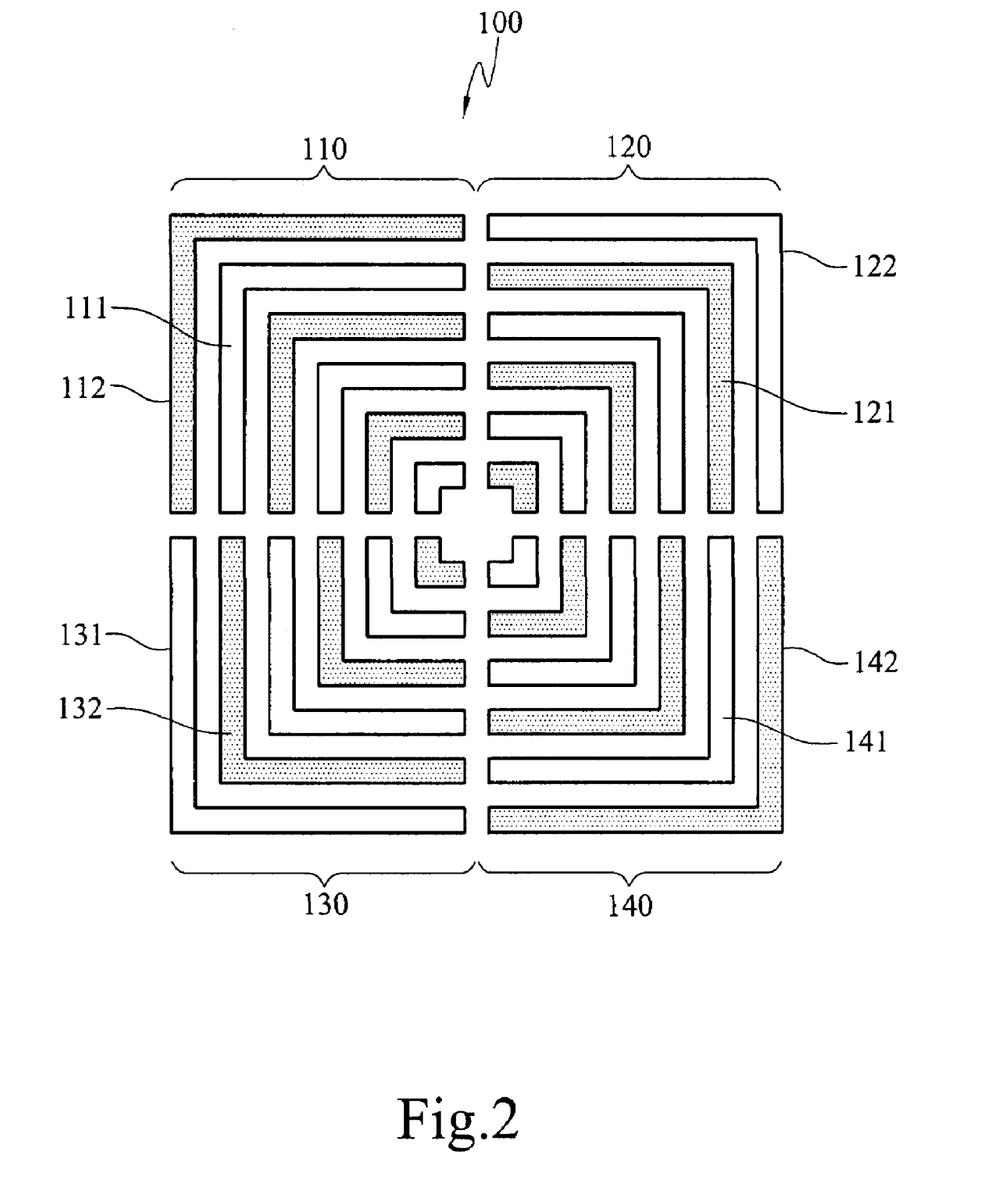
FIG. 2 is a schematic structural diagram of another embodiment of the common centroid symmetric structure capacitor provided by the present invention.

Referring to FIG. 2, a schematic structural diagram of another embodiment of the common centroid symmetric structure capacitor provided by the present invention is shown. Similar to FIG. 1, the structure capacitor comprises the first metal layer 110, the second metal layer 120, the third metal layer 130, and the fourth metal layer 140. Each of the metal layers also has a plurality of metal wires and the metal wires on each of the metal layers are substantially in an L-shape. However, each of the metal layers on the first metal layer 110 and each of the metal layers on the fourth metal layer 140 are opposite to each other by an L-shaped opening, and each of the metal wires on the second metal layer 120 and each of the metal wires on the third metal layer 130 are opposite to each other by an L-shaped opening.

Figure 3:
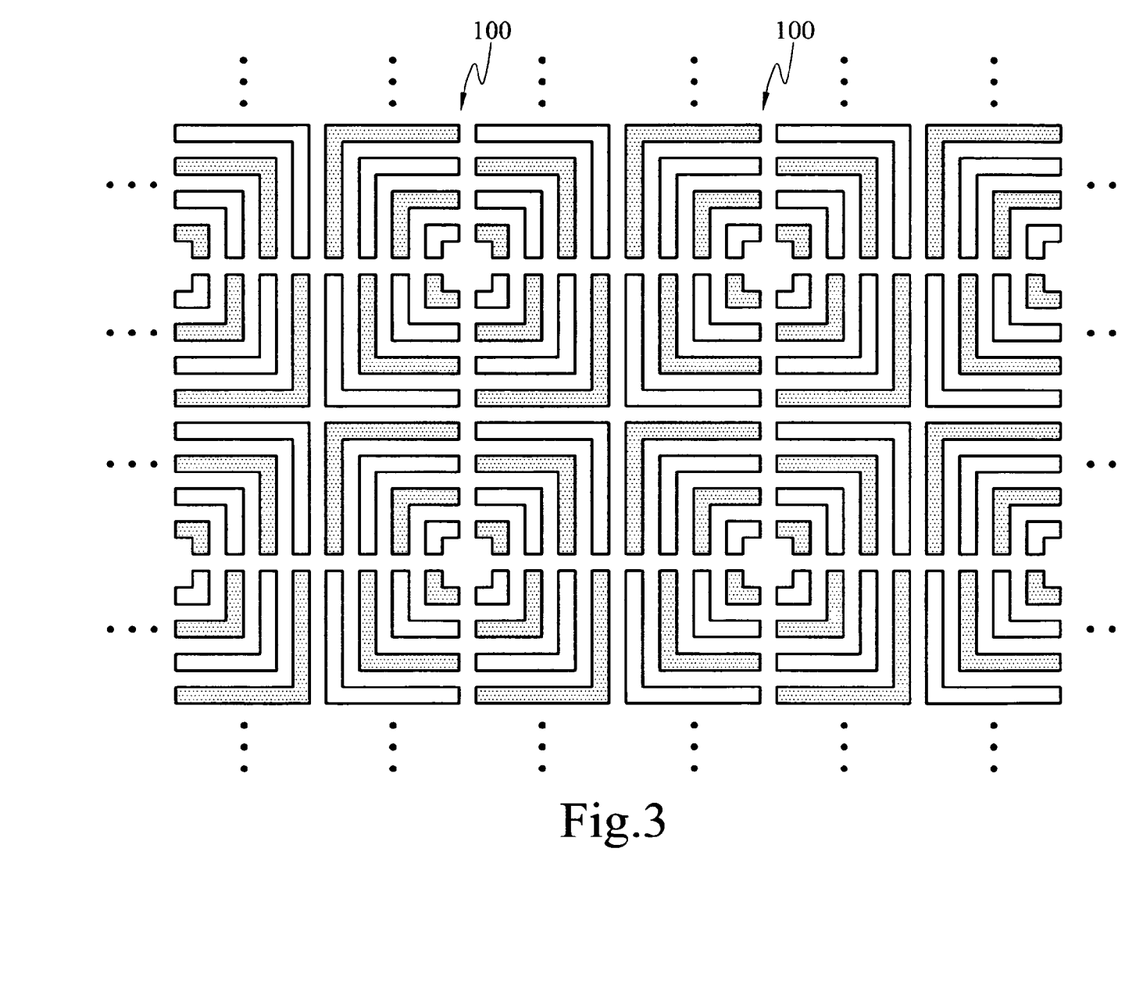
FIG. 3 shows one embodiment of the common centroid symmetric structure capacitor provided by the present invention.

The structures in FIG. 1 or FIG. 2 are repeatedly arranged to form an array of the capacitor structures in FIG. 3.

Figure 4:
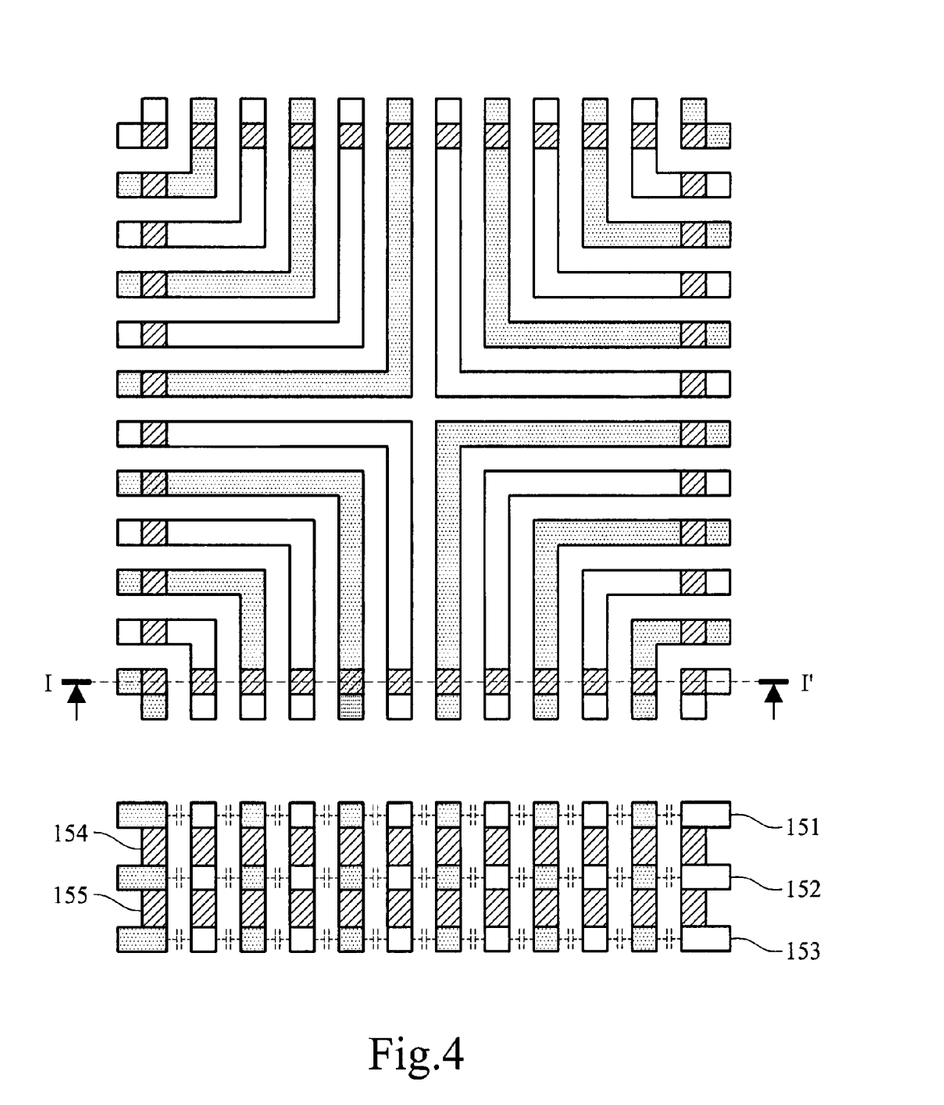
FIG. 4 is a schematic structural diagram of another embodiment of the common centroid symmetric structure capacitor provided by the present invention.

Referring to FIG. 4, a schematic structural diagram of another embodiment of the common centroid symmetric structure capacitor provided by the present invention is shown. In the embodiment shown by FIG. 1 or FIG. 2, the first metal layer 110, the second metal layer 120, the third metal layer 130, and the fourth metal layer 140 are disposed on the same metal layer, and only one metal layer exists. However, in the embodiment shown by FIG. 4, a plurality of metal layers exists, and each of the metal layers has the structure shown in FIG. 1 or FIG. 2 and is connected by a connection layer.

As shown in FIG. 4, a capacitor structure is formed by three metal layers 151, 152, and 153, a connection layer 154 connects the metal layer 151 and the metal layer 152, and the connection layer 155 connects the metal layer 152 and the metal layer 153. Through the embodiment in FIG. 4, the capacitors on different metal layers are connected in series, so as to increase electric capacity. The connection layer 154 and the connection layer 155 have a plurality of vias, respectively, so as to connect the corresponding metal wires on different metal layers.

Figure 5:
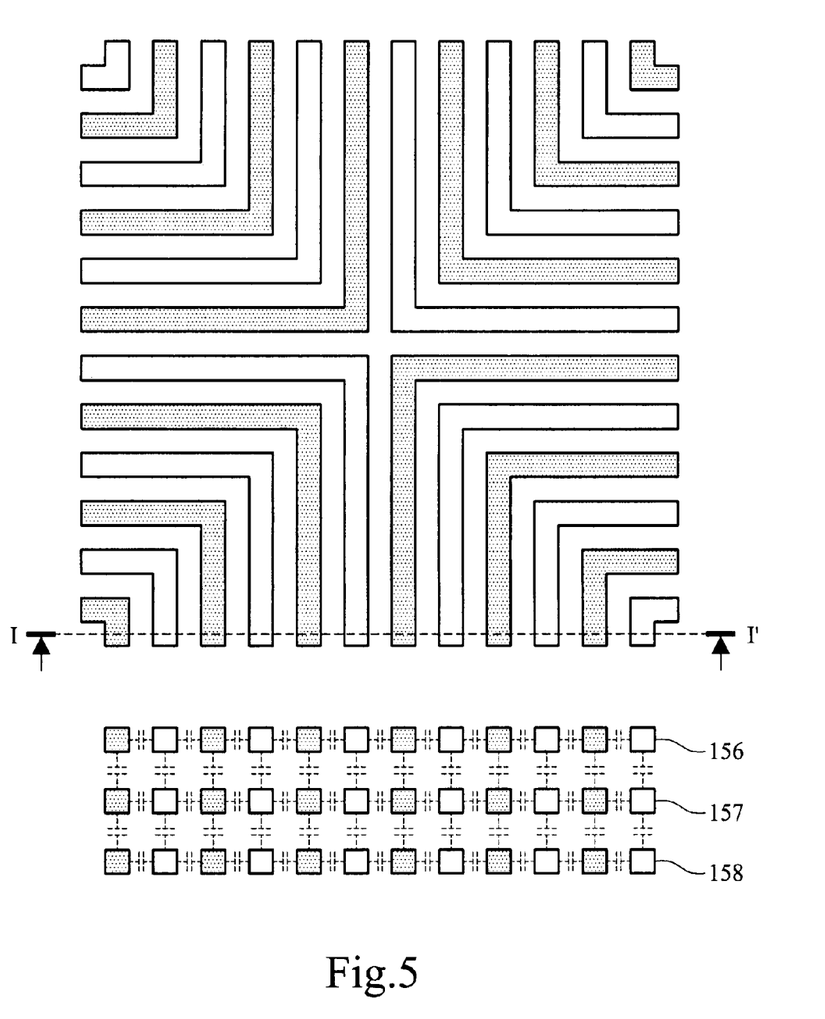
FIG. 5 is a schematic structural diagram of still another embodiment of the common centroid symmetric structure capacitor provided by the present invention.

Referring to FIG. 5, a schematic structural diagram of still another embodiment of the common centroid symmetric structure capacitor provided by the present invention is shown. A capacitor structure is formed by three metal layers 156, 157, and 158. Each of the metal layers has the structure shown in FIG. 1 or FIG. 2. The capacity effect is formed not only on the same metal layer, but also between different metal layers.

The metal layers 156, 157, and 158 all have the first metal layer 110, the second metal layer 120, the third metal layer 130, and the fourth metal layer 140 shown in FIG. 1, and the difference is that the metal wires on the metal layer 156 and the metal wires on the metal layer 157 are arranged in an interlaced manner reversed to each other.

Figure 6:
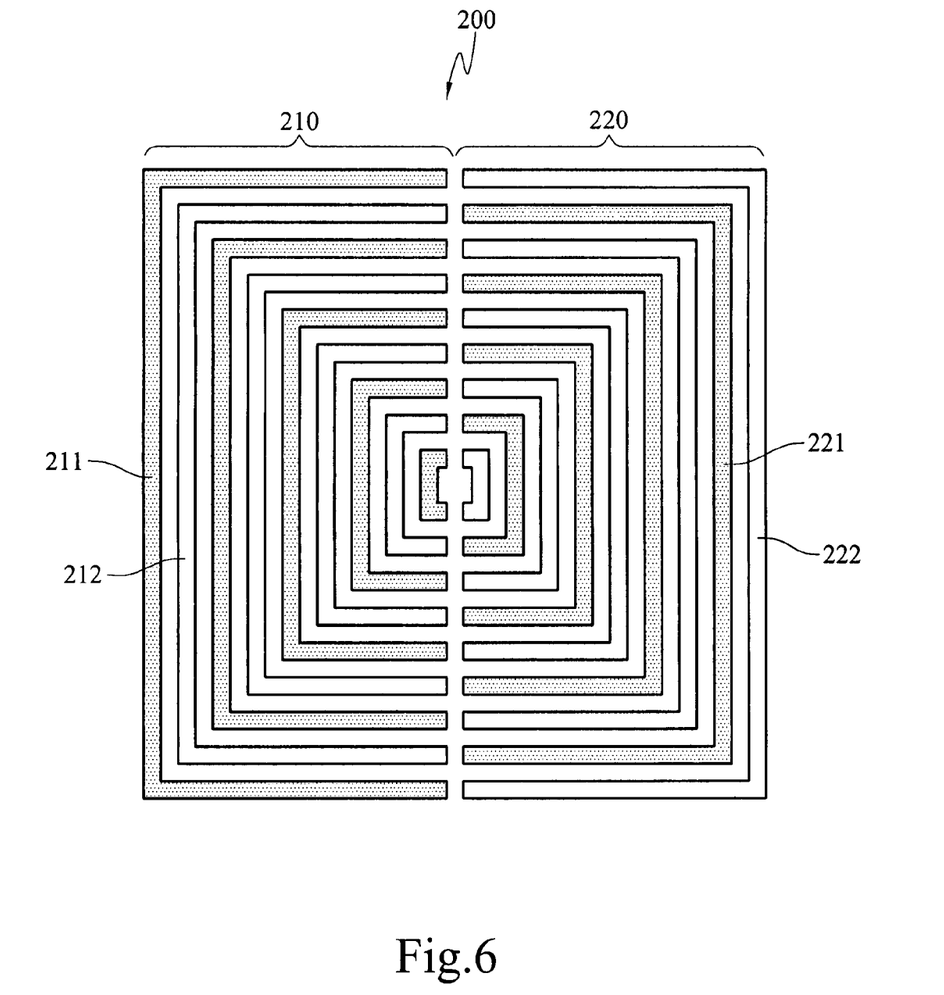
FIG. 6 is a schematic structural diagram of yet another embodiment of the common centroid symmetric structure capacitor provided by the present invention.

Referring to FIG. 6, a schematic structural diagram of yet another embodiment of the common centroid symmetric structure capacitor provided by the present invention is shown.

As shown in the figure, the common centroid symmetric structure capacitor 200 provided by the present invention comprises a first metal layer 210 and a second metal layer 220, and the first metal layer 210 is symmetric to the second metal layer 220.

The first metal layer 210 has a first set 211 of metal wires and a second set 212 of metal wires, with each set having a plurality of metal wires. Each of the metal wires in the first set 211 and each of the metal wires in the second set 212 are arranged in an interlaced manner.

The second metal layer 220 has a third set 221 of metal wires and a fourth set 222 of metal wires, with each set having a plurality of metal wires. Each of the metal wires in the third set 221 and each of the metal wires in the fourth set 222 are arranged in an interlaced manner different from that of the first metal layer 210.

In the embodiment shown by FIG. 6, the metal wires on each of the metal layers are substantially in a U-shape. However, other shapes, for example, arc-shape, can also be applied to the structure of the present invention.

The first metal layer 210 is arranged symmetric to the second metal layer 220. In the embodiment shown by FIG. 6, the U-shaped opening of the first metal layer 210 is opposite to that of the second metal layer 220. In the embodiment shown by FIG. 7, the U-shaped bottom of the first metal layer 210 is opposite to that of the second metal layer 220.

Figure 7:
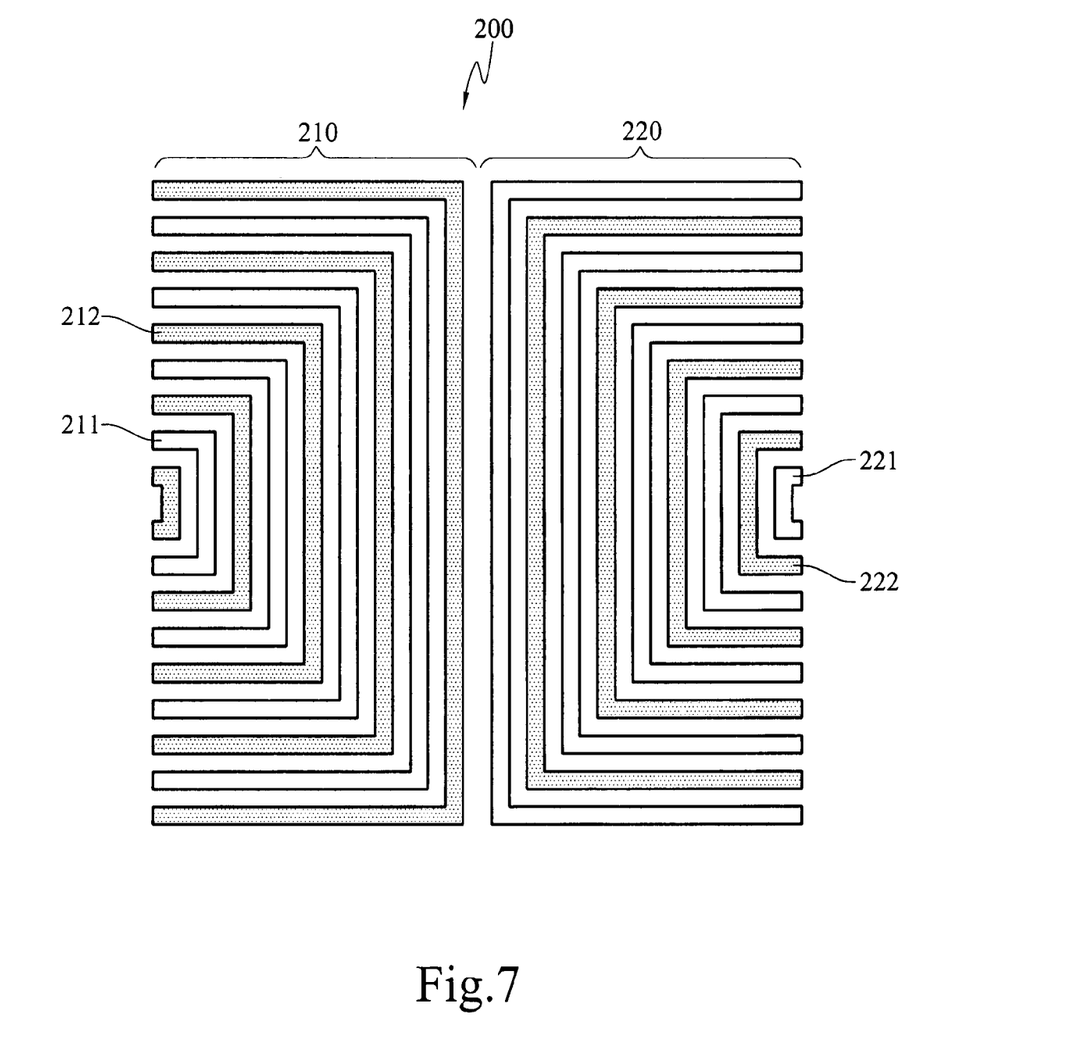
FIG. 7 is a schematic structural diagram of yet another embodiment of the common centroid symmetric structure capacitor provided by the present invention.
Figure 8:
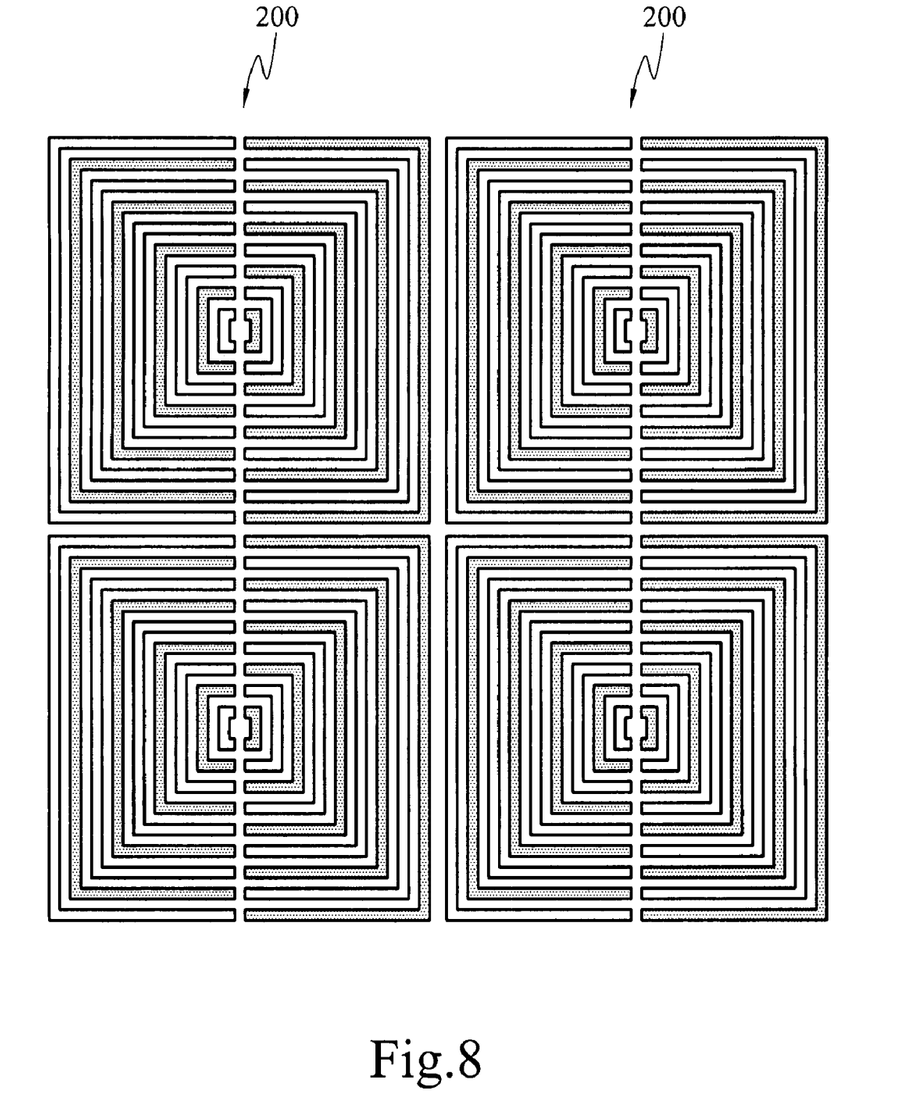
FIG. 8 is an embodiment of the common centroid symmetric structure capacitor provided by the present invention.

The structures in FIG. 6 or FIG. 7 are repeatedly arranged to form an array of the capacitor structures in FIG. 8.

Figure 9:
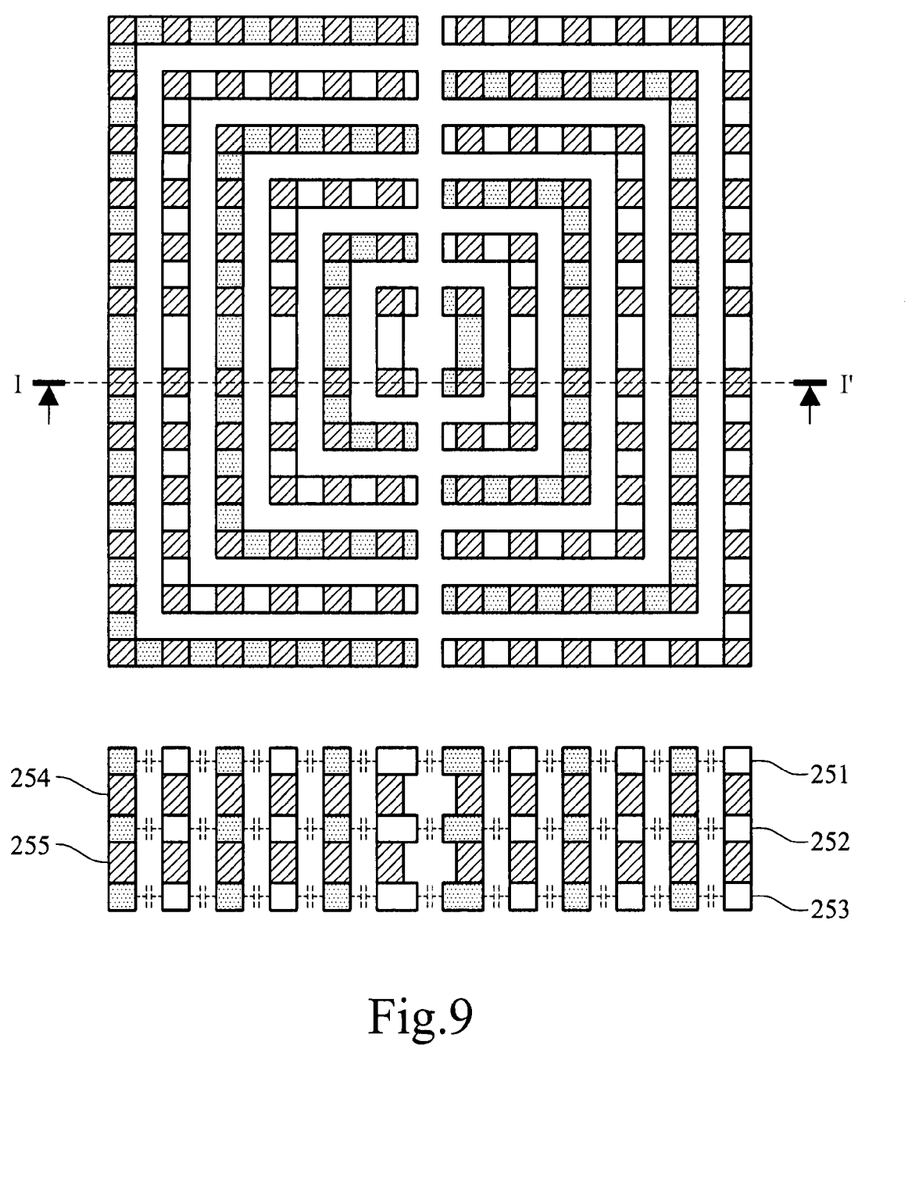
FIG. 9 is a schematic structural diagram of yet still another embodiment of the common centroid symmetric structure capacitor provided by the present invention.

Referring to FIG. 9, a schematic structural diagram of yet still another embodiment of the common centroid symmetric structure capacitor provided by the present invention is shown. The structure capacitor has a plurality of metal layers, and each of the metal layers has the structure shown in FIG. 6 or FIG. 7 and is connected by a connection layer.

As shown in FIG. 9, a capacitor structure is formed by three metal layers 251, 252, and 253, a connection layer 254 connects the metal layer 251 and the metal layer 252, and a connection layer 255 connects the metal layer 252 and the metal layer 253. Through the embodiment shown in FIG. 9, the capacitors on different metal layers are connected in series, so as to increase electric capacity. The connection layers 254 and 255 have a plurality of vias, respectively, so as to connect the corresponding metal wires on different metal layers.

Figure 10:
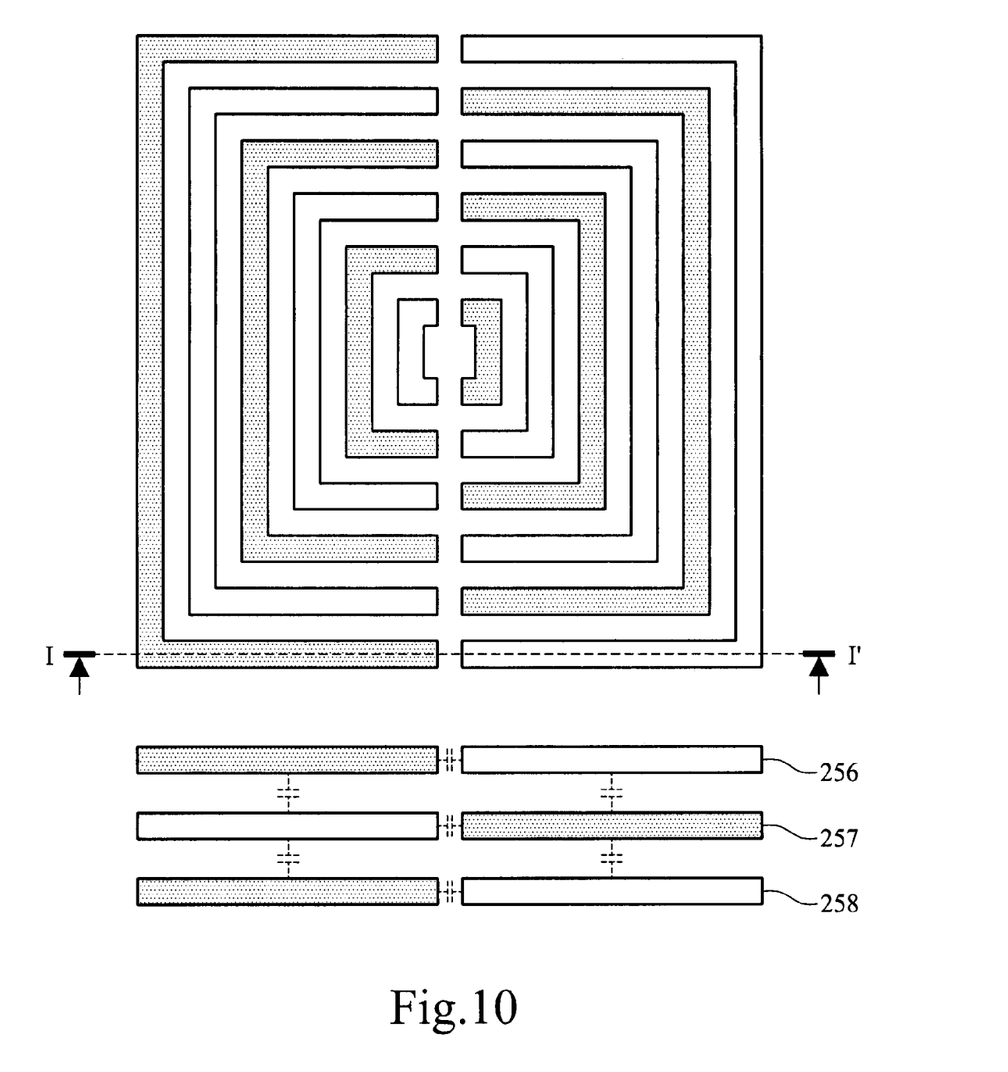
FIG. 10 is a schematic structural diagram of yet again another embodiment of the common centroid symmetric structure capacitor provided by the present invention.

Referring to FIG. 10, a schematic structural diagram of yet again another embodiment of the common centroid symmetric structure capacitor provided by the present invention is shown. A capacitor structure is formed by three metal layers 256, 257, and 258, and each of the metal layers has the structure shown in FIG. 6 or FIG. 7. The capacity effect is formed not only on the same metal layer, but also between different metal layers.

Referring to FIG. 10, a method of manufacturing the embodiment shown in FIG. 4 is shown.

The common centroid symmetric structure capacitor provided by the present invention can be achieved through a standard CMOS process. Referring to FIGS. 11A to 11G, exemplary processes of manufacturing a face-centered cubic structure capacitor provided by the present invention are shown. For example, in FIGS. 11A to 11G, the section along Line II' in FIG. 4 is shown for further illustration.

Figure 11A:
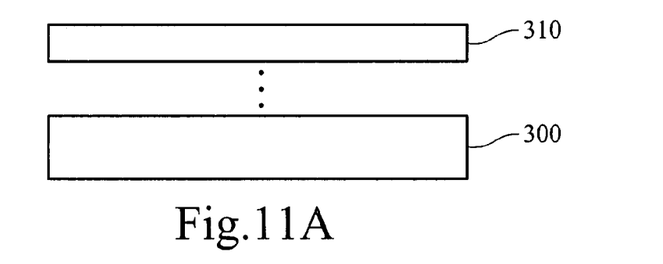
FIGS. 11A to 11G are process flows of manufacturing the common centroid symmetric structure capacitor provided by the present invention.

Referring to FIG. 11A, the capacitor is formed on a substrate 300. In an embodiment, other components or circuits may also be formed on the substrate 300, but for the sake of simplicity, these components or circuits are not described or shown in the drawings.

A first metal layer 310 having the structure shown in FIG. 1 is formed first, and the structure comprises the first metal layer 110, the second metal layer 120, the third metal layer 130, and the fourth metal layer 140. The first metal layer 110 is adjacent to the second metal layer 120, the third metal layer 130 is adjacent to the first metal layer 110, the fourth metal layer 140 is adjacent to the second metal layer 120, and the first metal layer 110 is symmetric to the fourth metal layer 140, the second metal layer 120 is symmetric to the third metal layer 130. Then, a dielectric material is filled into the gaps of the first metal layer 310.

In another embodiment, a dielectric layer can also be formed first, and is exposed and developed with a mask as shown in FIG. 4. In this manner, the portions are etched for forming the first metal layer 110, the second metal layer 120, the third metal layer 130, and the fourth metal layer 140, and a metal material is then deposited to the corresponding positions.

Figure 11B:
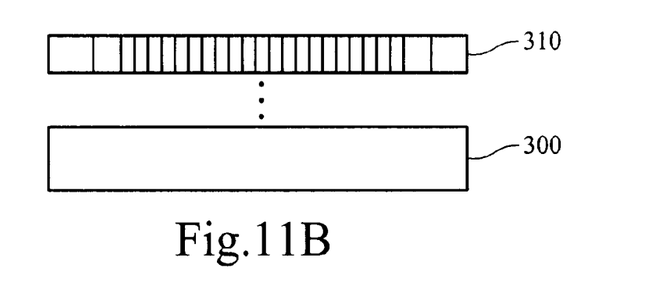
Figure 11C:
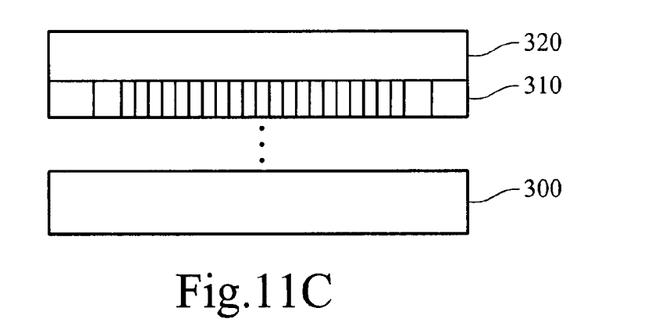
Figure 11D:
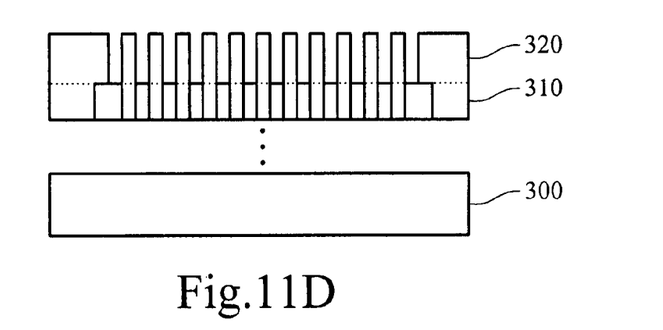
Figure 11E:
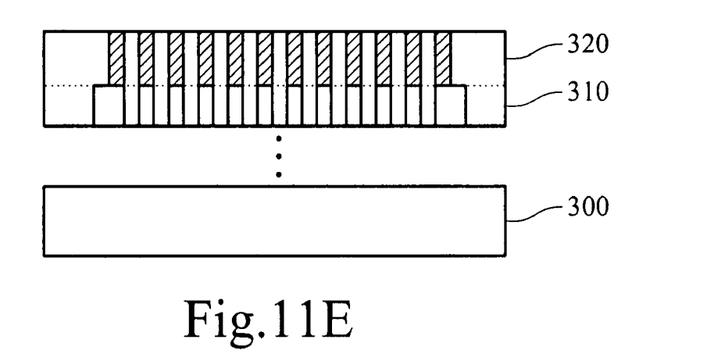
Figure 11F:
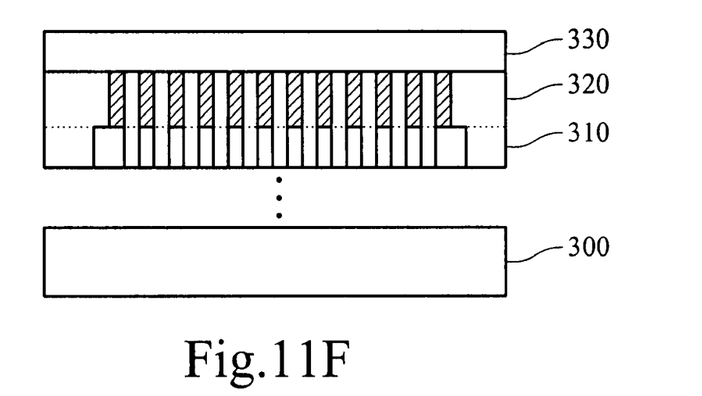
Figure 11G:
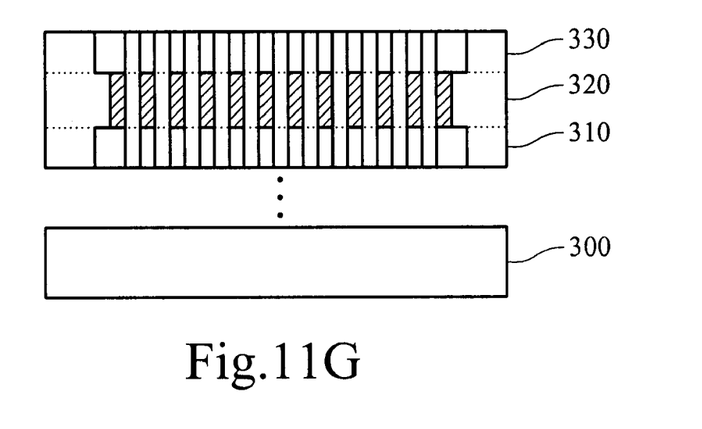

Afterward, a connection layer 320 is formed. Referring to FIGS. 11C to 11E, a dielectric layer is formed first. Next, the positions corresponding to the first metal layer 110, the second metal layer 120, the third metal layer 130, and the fourth metal layer 140 are etched and a metal is then filled in. Finally, the steps shown in FIG. 11A and FIG. 11B are repeated to form a metal layer 330.

Referring to FIGS. 12A to 12G, exemplary processes of manufacturing a face-centered cubic structure capacitor provided by the present invention are shown. For example, in FIGS. 12A to 12G, the section along Line II' in FIG. 9 is shown for further illustration.

Figure 12A:
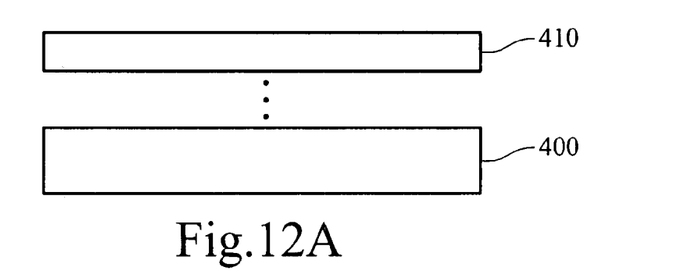
FIGS. 12A to 12G are process flows of manufacturing the common centroid symmetric structure capacitor provided by the present invention.

Referring to FIG. 12A, the capacitor is formed on a substrate 400. In one embodiment, other components or circuits may also be formed on the substrate 400, but for the sake of simplicity, these components or circuits are not described or shown in the drawings.

A first metal layer 410 having the structure shown in FIG. 6 is formed first, and the structure comprises the first metal layer 210 and the second metal layer 220. Then, a dielectric material is filled into the gaps of the first metal layer 410.

In another embodiment, a dielectric layer can also be formed first, and is exposed and developed with a mask as shown in FIG. 8. In this manner, the portions are etched for forming the first metal layer 210 and the second metal layer 220, and a metal material is then deposited to the corresponding positions.

Figure 12B:
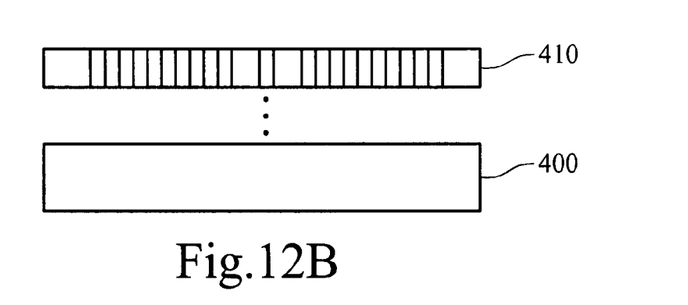
Figure 12C:
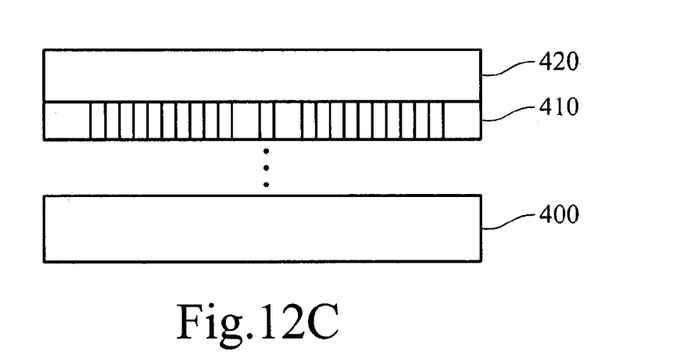
Figure 12D:
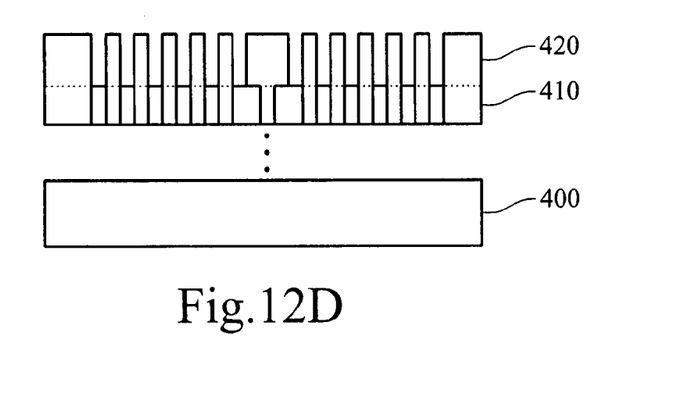
Figure 12E:
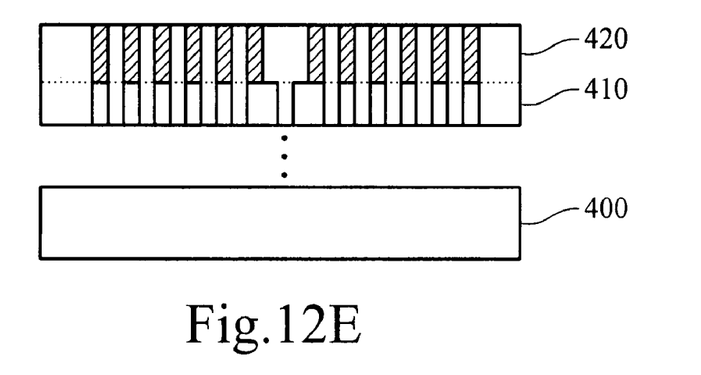
Figure 12F:
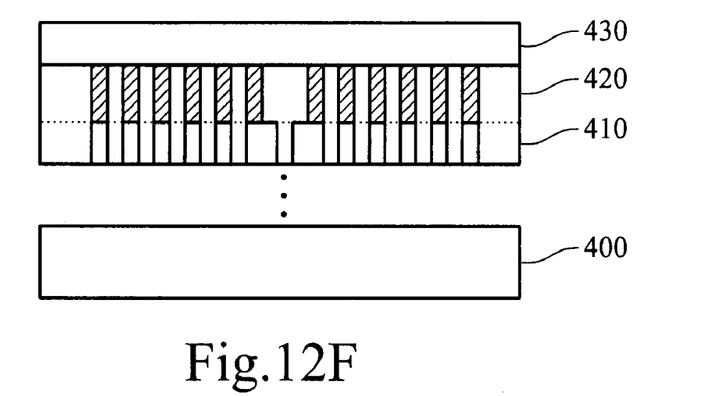
Figure 12G:
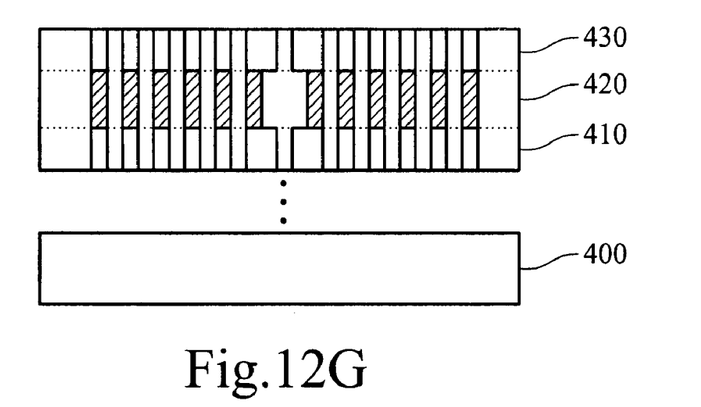

Afterward, a connection layer 420 is formed. Referring to FIGS. 12C to 12E, a dielectric layer is formed first. Next, the positions corresponding to the first metal layer 210 and the second metal layer 220 are etched and a metal is then filled in. Finally, the steps shown in FIG. 12A and FIG. 12B are repeated to form a metal layer 430.

Concerning the capacitor structure provided by the present invention, the capacitance is realized by a lateral electric field between metal wires on the same layer. Therefore, with the reduction of effective line width, the electric capacity in a unit area is increased. That is, for the same capacitance value, the capacitor structure provided by the present invention can effectively save the area required by the layout, thereby reducing the manufacturing cost of the chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A common centroid symmetric structure capacitor, comprising:
    a first metal layer, having a first set of metal wires and a second set of metal wires, the first set and the second set each having a plurality of metal wires, wherein each of the metal wires in the first set and each of the metal wires in the second set are arranged in an interlaced manner;
    a second metal layer, adjacent to the first metal layer and having a third set of metal wires and a fourth set of metal wires, the third set and the fourth set each having a plurality of metal wires, wherein each of the metal wires in the third set and each of the metal wires in the fourth set are arranged in an interlaced manner;
    a third metal layer, adjacent to the first metal layer and having a fifth set of metal wires and a sixth set of metal wires, the fifth set and the sixth set each having a plurality of metal wires, wherein each of the metal wires in the fifth set and each of the metal wires in the sixth set are arranged in an interlaced manner, and the second metal layer and the third metal layer are arranged symmetrically about a diagonal line; and
    a fourth metal layer, adjacent to the second metal layer and having a seventh set of metal wires and an eighth set of metal wires, the seventh set and the eighth set each having a plurality of metal wires, wherein each of the metal wires in the seventh set and each of the metal wires in the eighth set are arranged in an interlaced manner, and the first metal layer and the fourth metal layer are arranged symmetrically about an another diagonal line;
    wherein each of the metal wires in the first set to the eighth set of metal wires is in an L-shape; and
    wherein each of the metal wires on the first metal layer and each of the metal wires on the fourth metal layer are opposite to each other by an L-shaped opening, and each of the metal wires on the second metal layer and each of the metal wires on the third metal layer are opposite to each other by an L-shaped opening.

2. The common centroid symmetric structure capacitor as claimed in claim 1, further comprising:
    at least one metal layer, wherein each of the at least one metal layer has the first metal layer, the second metal layer, the third metal layer, and the fourth metal layer; and
    at least one connection layer used for connecting each of the at least one metal layer.

* * * * *